(12) United States Patent
Arie et al.

(10) Patent No.: US 9,466,358 B1
(45) Date of Patent: Oct. 11, 2016

(54) STRUCTURE FOR STATIC RANDOM ACCESS MEMORY

(71) Applicant: International Business Machines Corporation, Armonk, NY (US)

(72) Inventors: Lior Arie, Haifa (IL); Lidar Herooti, Haifa (IL); Noam Jungmann, Tel Aviv (IL); Elazar Kachir, Haifa (IL); Hezi Shalom, Haifa (IL); Israel A. Wagner, Haifa (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/751,354

(22) Filed: Jun. 26, 2015

(51) Int. Cl.
| | |
|---|---|
| G11C 11/00 | (2006.01) |
| G11C 11/419 | (2006.01) |
| G06F 17/50 | (2006.01) |
| G11C 7/18 | (2006.01) |
| G11C 16/10 | (2006.01) |
| G11C 16/08 | (2006.01) |
| G11C 11/413 | (2006.01) |
| G11C 11/412 | (2006.01) |
| G11C 16/04 | (2006.01) |

(52) U.S. Cl.
CPC ........... *G11C 11/419* (2013.01); *G06F 17/505* (2013.01); *G11C 7/18* (2013.01); *G11C 11/412* (2013.01); *G11C 11/413* (2013.01); *G11C 16/08* (2013.01); *G11C 16/10* (2013.01); *G06F 2217/78* (2013.01); *G11C 16/0483* (2013.01)

(58) Field of Classification Search
CPC . G11C 11/412; G11C 11/413; G11C 11/419; G11C 16/08; G11C 16/10; G11C 16/0483; G11C 7/18
USPC .................................... 365/154, 156, 185.13
See application file for complete search history.

(56) References Cited

U.S. PATENT DOCUMENTS

| | | | |
|---|---|---|---|
| 8,842,487 B2* | 9/2014 | Behrends | G11C 11/419 |
| | | | 365/154 |
| 9,007,857 B2* | 4/2015 | Adams | G11C 7/12 |
| | | | 365/154 |
| 9,058,866 B2* | 6/2015 | Freiburger | G11C 11/00 |
| 9,087,563 B2* | 7/2015 | Freiburger | G11C 7/1096 |
| 2015/0002190 A1 | 1/2015 | Huang et al. | |

OTHER PUBLICATIONS

Disclosed Anonymously, "Memory Architecture for Implementing Multiple Decode Schemes," IP.com Technical Disclosure No. 000235866, Mar. 28, 2014.

* cited by examiner

*Primary Examiner* — Pho M Luu

(57) ABSTRACT

A design structure can include elements that, when processed in a semiconductor manufacturing facility, produce an SRAM that includes a first local evaluator coupled to a first global bit line (GBL) and a first set of local bit lines (LBLs). The SRAM can also include a second local evaluator communicatively coupled to the first local evaluator. The second local evaluator is coupled to a second GBL and second set of LBLs. The second GBL is consecutive to the first GBL. The first and second evaluators are to generate signals from the LBLs such that one GBL of a combined first and second GBLs is active at any point in a read or write cycle.

15 Claims, 9 Drawing Sheets

200A

200B

300

| GBLs-OLD | | | | Internal T/C Nodes | GBLs-NEW | | | |
|---|---|---|---|---|---|---|---|---|
| GC<0> | GT<0> | GC<1> | GT<1> | C<0>,T<0>,C<1>,T<1> | G<0> | G<1> | G<2> | G<3> |
| 1 | 0 | 1 | 0 | 1010 | 0 | 1 | 0 | 0 |
| 1 | 0 | 0 | 1 | 1001 | 0 | 0 | 0 | 1 |
| 0 | 1 | 1 | 0 | 0110 | 0 | 0 | 1 | 0 |
| 0 | 1 | 0 | 1 | 0101 | 1 | 0 | 0 | 0 |

STRUCTURE FOR STATIC RANDOM ACCESS MEMORY

BACKGROUND

The present techniques relate to a static random access memory (SRAM) design structure. More specifically, the present techniques relate to a design structure for an SRAM including logic for saving power.

SUMMARY

According to an embodiment described herein, a design structure tangibly embodied in a machine-readable storage medium used in design, manufacture, or simulation of a static random access memory (SRAM), the design structure including elements that, when processed in a semiconductor manufacturing facility, produce an SRAM. The design structure can include a first local evaluator coupled to a first global bit line (GBL) and a first set of local bit lines (LBLs). The design structure also can include a second local evaluator communicatively coupled to the first local evaluator. The second local evaluator can be coupled to a second GBL and second set of LBLs. The second GBL can be consecutive to the first GBL. The first and second evaluators are to generate signals from the LBLs such that only one GBL of a combined first and second GBLs is active at any point in a read or write cycle.

According to another embodiment described herein, a method in a computer-aided design system for generating a functional design model of a static random access memory includes generating a functional representation of a first local evaluation logic coupled to a first set of consecutive global bit lines (GBLs) and a first set of local bit lines (LBLs), the first local evaluation logic comprising a plurality of devices. The method also includes generating a functional representation of a second local evaluation logic communicatively coupled to the first local evaluation logic via the devices. The second local evaluation logic can be coupled to a second set of consecutive GBLs and a second set of LBLs. The second set of consecutive GBLs can be consecutive to the first set of consecutive GBLs. The first and second evaluation logics are to generate signals from the LBLs such that one GBL is to be active at any point in a read or write cycle and the other GBLs are not concurrently active.

According to another embodiment described herein, a static random access memory (SRAM) can include a first local evaluation logic coupled to a first set of consecutive global bit lines (GBLs) and a first set of local bit lines (LBLs). The SRAM can also include a second local evaluation logic communicatively coupled to the first local evaluation logic. The second local evaluation logic can be coupled to a second set of consecutive GBLs and second set of LBLs. The second set of consecutive GBLs can be consecutive to the first set of consecutive GBLs. The first and second evaluation logics are to generate a one-hot-of-four signal from the LBLs such that only one GBL of a combined first and second set of GBLs is active at any point in a read or write cycle.

According to another embodiment described herein, a computing system includes a static random access memory (SRAM). The SRAM can include a first local evaluation logic coupled to a first set of consecutive global bit lines (GBLs) and a set of local bit lines (LBLs). The SRAM can also include a second local evaluation logic communicatively coupled to the first local evaluation logic. The second local evaluation logic coupled to a second set of consecutive GBLs and second set of LBLs. The second set of consecutive GBLs can be consecutive to the first set of consecutive GBLs. The first and second evaluation logics are to generate a one-hot-of-four signal from the LBLs such that only one GBL is active at any point in a read or write cycle.

BRIEF DESCRIPTION OF THE SEVERAL VIEWS OF THE DRAWINGS

FIG. 4 is an example truth table for encoding internal T/C nodes according to embodiments herein;

DETAILED DESCRIPTION

Figure 1:
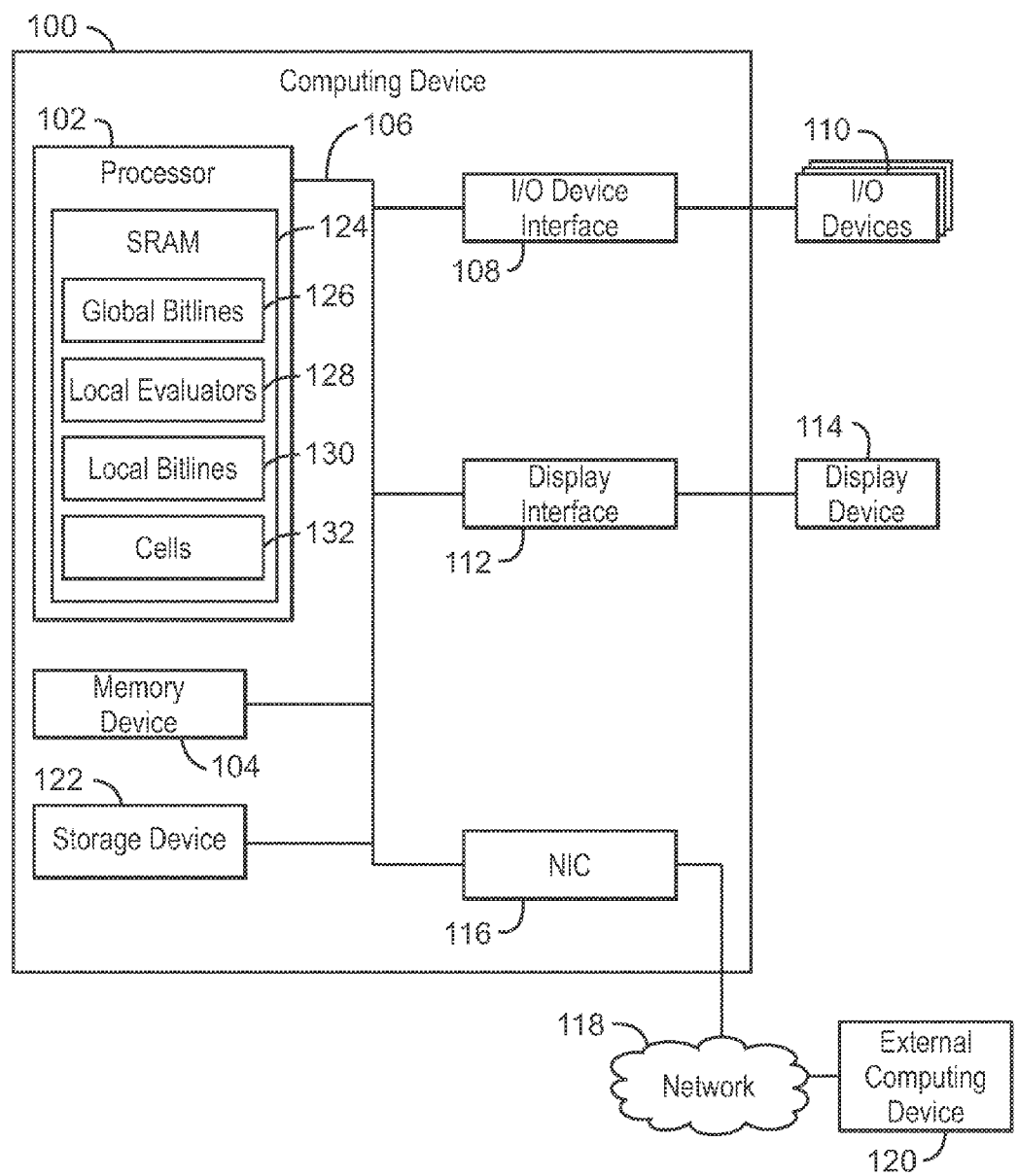
FIG. 1 is block diagram of an example computing device that includes a SRAM with power saving logic according to embodiments herein.

An SRAM array typically includes a plurality of cells that are arranged into word lines and bit lines and logic in the form of local evaluators, also called local evaluation logics, to process reads and writes to and from the SRAM array. In larger static random access memory (SRAM) arrays with many cells, bit lines can be arranged into a hierarchy of levels. For example, 34 SRAM cells can be multiplexed into a single local bit line (LBL). Two or four of the LBLs can then be multiplexed into a single global bit line (GBL) via a local evaluator. Thus, for example, 100 GBLs can be used to access 3400 SRAM cells (for a 1:1 local evaluator) or 13,600 SRAM cells (for a 4:1 local evaluator) depending on the local evaluator multiplexing ratio. In a differential GBL, local evaluators are typically coupled to two GBLs each, labeled True (T) and Complement (C), where the data is encoded in a 1-of-2 code. In a single-sided GBL, a single wire is allocated for each GBL. Moreover, each local evaluator generally has one of its GBLs hot, or actively powered, at any point in time in a read or write cycle. Hence, one or two pairs of GBLs, in the traditional structure, have 2-hot-of-4 lines. GBLs are usually large power consumers as they tend to be long wires with high capacitance that have a high switching factor when SRAM array is being accessed.

According to embodiments of the present disclosure, an SRAM can be designed to function in a one-hot-of-four configuration for each pair of GBLs. A one-hot-of-four configuration refers to only one GBL of four GBLs being hot, or having a logical value of 1, at any point in a read or write cycle. Local evaluators can be paired and have logic included to communicate with each other. The local evaluators can each be coupled to a set of GBLs. For example, each local evaluator can be couple to two GBLs for a total of four GBLs coupled to the pair of local evaluators. Each local evaluator can also include logic such that one of the set of GBLs coupled to the pair of local evaluators is active at any point in time. For example, one GBL can be active during a write cycle and one during a read cycle. Thus, in the example of four total GBLs, one of the four GBLs are hot, or active, at any point in a complete read or write cycle. A one-hot-of-four configuration thus has a potential advantage of a GBL power saving of up to 50% when compared to a one-hot-of-two configuration. Moreover, the one-hot-of-four configuration also has the potential advantage of being a relatively simple modification to the traditional one-hot-of-two configuration. It is to be understood that some embodiments of the present techniques may not have these potential advantages and that these potential advantages are not necessarily required of all embodiments. For example, the techniques described herein can be used in embodiments where one GBL can be hot out of six or more bit lines. These embodiments may not necessarily have the same advantages as the one-hot-of-four embodiment.

With reference now to FIG. 1, an example computing device 100 can include a processor 102 using SRAM with power saving logic according to embodiments herein. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is adapted to execute stored instructions, a memory device 104 to provide temporary memory space for operations of said instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., Peripheral Component Interconnect (PCI)®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the internet small computer system interface, among others. The network 118 may be a cellular network, a radio network, a wide area network (WAN), a local area network (LAN), or the Internet, among others. An external computing device 120 may connect to the computing device 100 through the network 118. In some examples, external computing device 120 may be an external webserver.

The processor 102 may also be linked through the system interconnect 106 to a storage device 122 that can include a hard drive, an optical drive, a USB flash drive, an array of drives, or any combinations thereof. In some examples, the storage device may include a processor design module 124. The processor design module 124 may contain a one or more design structures for producing processors in accordance with the techniques described herein. A design structure, as used herein, may be a logical simulation design structure that is a logically equivalent functional representation of a hardware device or comprise data and/or program instructions that can be used to generate a functional representation of the physical structure of a hardware device, as discussed in greater detail in FIG. 5. For example, processor design module 124 may perform the method 300 described in more detail below.

The processor 102 may also include an SRAM module 124 with a set of GBLs 126 and a set of local evaluators (LEs) 128. The local evaluators 128 can include logic to control reads and writes to and from an SRAM array. The GBLs 126 can be coupled to a plurality of LBLs 130. The LBLs 130 can be coupled to a plurality of cells capable of storing bits of data in the SRAM.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). For example, the functionality may be implemented with an application specific integrated circuit, logic implemented in an embedded controller, or in logic implemented in the processor 102, among others. In some embodiments, the functionalities of the SRAM design module 124 can be implemented with logic, wherein the logic, as referred to herein, can include any suitable hardware (e.g., a processor, among others), software (e.g., an application, among others), firmware, or any suitable combination of hardware, software, and firmware.

Figure 2A:
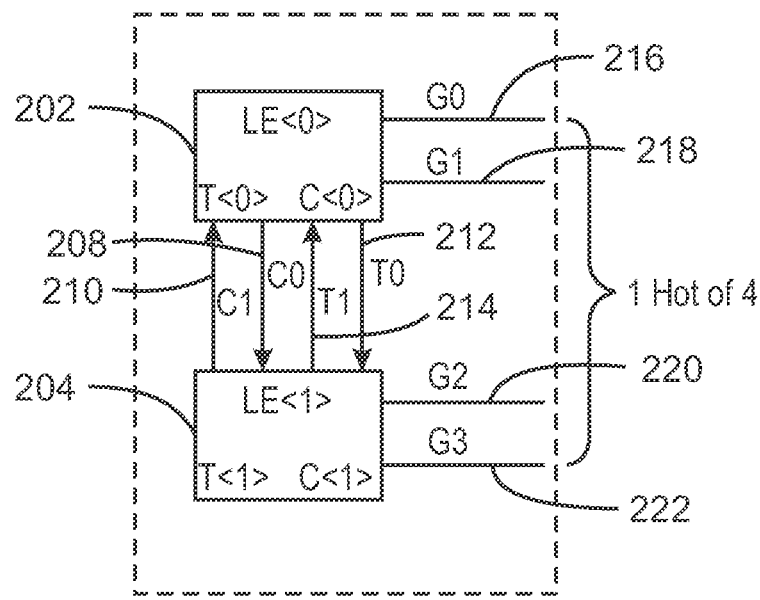
FIG. 2A is a block diagram of an example SRAM with a pair of local evaluators according to embodiments herein.

FIG. 2A is a block diagram of an example SRAM 200A with a pair of local evaluators 202, 204 according to embodiments herein. The example SRAM of FIG. 2A is generally referred to by the reference number 200A.

In the example SRAM 200A, two local evaluators 202, 204 are shown coupled via four neighbor control Input/Output (I/O) lines 208, 210, 212, 214. Neighbor-control I/O lines 210 and 214 are shown connecting from local evaluator 204 to local evaluator 202. The neighbor control I/O lines 208 and 212 are shown connecting from local evaluator 202 to local evaluator 204. Local evaluator 202 is coupled to GBLs 216 and 218. Local evaluator 204 is coupled to GBLs 220 and 222.

In the example SRAM 200A, the local evaluators 202, 204 can be connected to a set of LBLs (not shown) and a set of GBLs 216, 218, 220, 222. In the example of 200A, one of the four GBLs 216, 218, 220, 222 are active at any point in time. As used herein, being "active" refers to having a logical state of "1." The one-hot-of-four active state enables a power saving over having one GBL powered per local evaluator, also known as a two-hot-of-four design. The local evaluators 202, 204 communicate via neighbor control I/O lines 208, 210, 212, 214. In particular, neighbor control I/O lines C1 210 and T1 212 can send signals from LE<1> 204 to LE<0> 202. Neighbor control I/O lines C0 208 and T0 212 can send signals in an opposing direction from LE<0> 202 to LE<1> 204. The sharing of signals over lines C1 210, T1 212, C0 208, and T0 212 enable sharing of information from the LBLs (not shown) from one local evaluator 202, 204 to the other local evaluator 204, 202, respectively. Thus, the output of each GBL 216, 218, 220, 222 is a function of all the LBLs of both of the local evaluators 202, 204. The schematic of local evaluator 202 is described in detail with respect to FIG. 3 below.

It is to be understood that the block diagram of FIG. 2A is not intended to indicate that the SRAM 200A is to include all of the components shown in FIG. 2A. Rather, the SRAM 200A can include fewer or additional components not illustrated in FIG. 2A (e.g., additional local evaluators, neighbor control lines, GBLs, etc.).

Figure 2B:
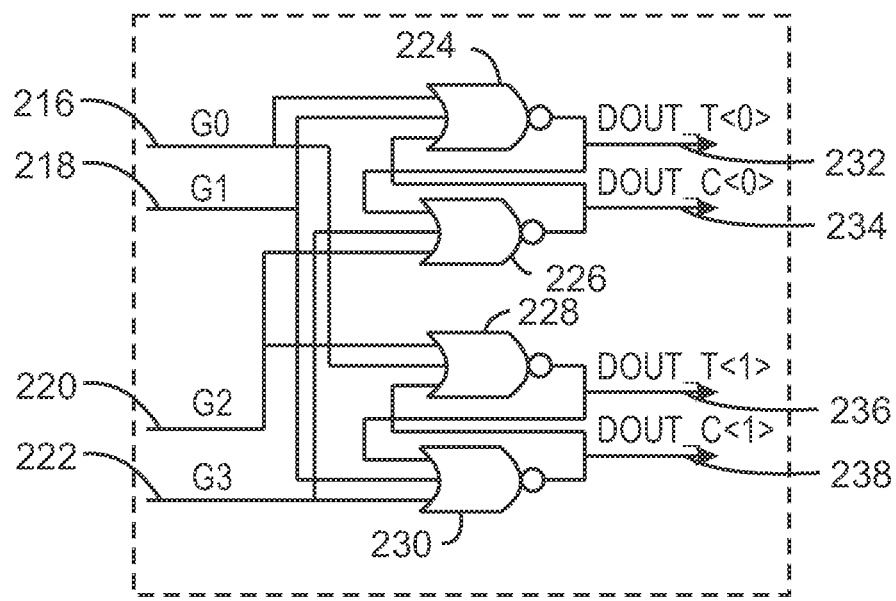
FIG. 2B is a block diagram of an example SRAM with a GBL receiver having four NOR gates according to embodiments herein.

FIG. 2B is a logic diagram of an example SRAM 200B with a GBL receiver having four NOR gates according to embodiments herein according to embodiments herein. The example SRAM of FIG. 2B is generally referred to by the reference number 200B.

In the example logic diagram of SRAM 200B, four GBLs 216, 218, 220, 222 are shown connected to four three-way NOR gates 224, 226, 228, 230. A GBL 216 is connected to an input of NOR gates 224 and 228. A GBL 218 is connected to the input of NOR gates 224 and 230. A GBL 220 is connected to the input of NOR gates 226 and 228. A GBL 222 is connected to the input of NOR gates 226 and 230. The NOR gates 224, 226, 228, 230 are shown producing output T/C node value 232, 234, 236, 238, respectively. In addition, the output 232 of NOR gate 224 is also an input of NOR gate 226. Output 234 of NOR gate 226 is also an input of NOR gate 224. The output 236 of NOR gate 228 is likewise an input for NOR gate 230. The output 238 of NOR gate 230 is an input for NOR gate 228.

In example SRAM 200B, two pairs of three-way NOR gates 224, 226 and 228, 230 are interconnected such that the signals of GBLs 216, 218, 220, 222 can be translated to the T/C node values as described in detail with respect to the truth table of FIG. 4 below. For example, the three-way NOR gates 224, 226, 228, and 230 can be configured in a set-reset flip-flop configuration. As used herein, the T in T/C stands for True and the C stands for Complement. Thus, the three-way NOR gates 224, 226, 228, 230 enable a set of T/C values to be decoded from a pair of local evaluators using one active GBL at any point in time, rather than two GBLs being active concurrently by two local evaluators. The DOUTs of outputs 232, 234, 236, 238 represent decoded binary data that has been decoded from the one-hot-of-four code of the GBLs. Using a one-hot-of-four configuration thus enables reduced power usage while processing the same amount of data. The GBL receiver enables the one-hot-of-four signals to be decoded into static binary outputs.

It is to be understood that the block diagram of FIG. 2B is not intended to indicate that the SRAM 200B is to include all of the components shown in FIG. 2B. Rather, the SRAM 200B can include fewer or additional components not illustrated in FIG. 2B (e.g., local evaluators, additional NOR gates, etc.).

Figure 3:
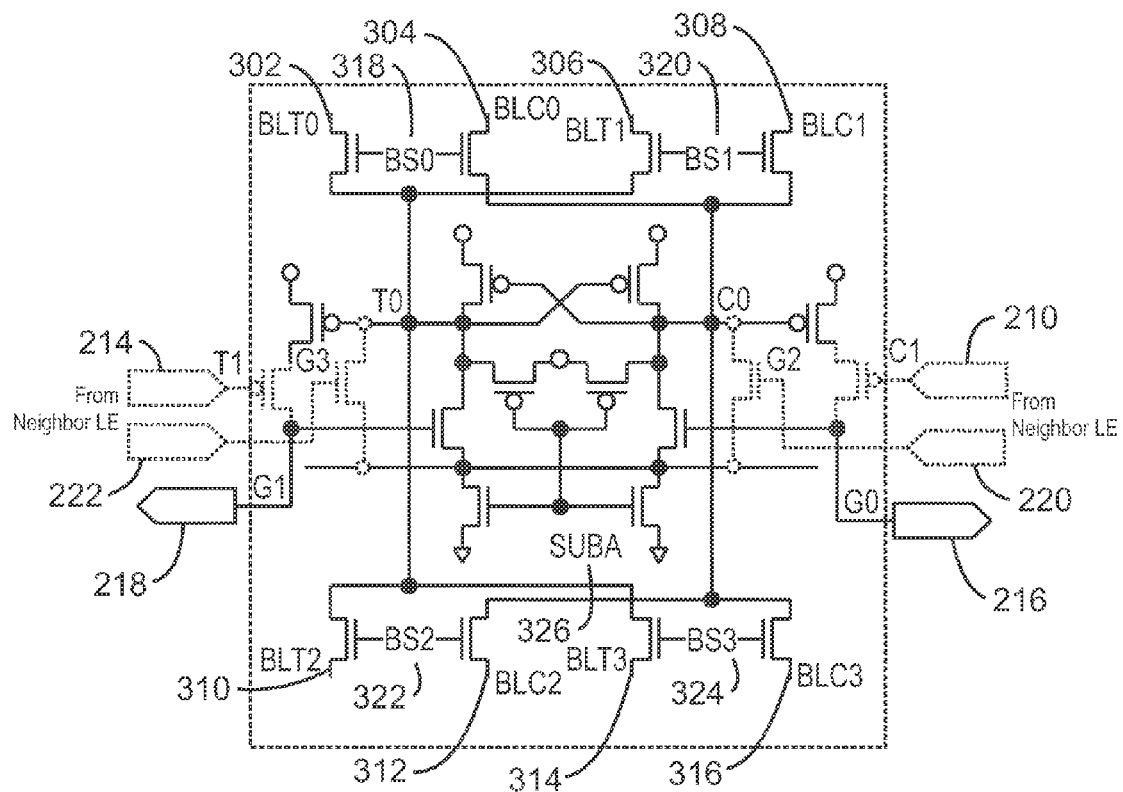
FIG. 3 is an example schematic of a local evaluator according to embodiments herein.

FIG. 3 is an example schematic of a local evaluator according to embodiments herein. The example schematic of FIG. 3 is referred to generally by the reference number 300 and is discussed with reference to FIG. 2.

The example schematic 300 shows a local evaluator that connects eight LBLs at inputs 302, 304, 306, 308, 310, 312, 314, and 316. For example, the example schematic 300 can be the local evaluator 202 of FIG. 2. Each bit line may further be coupled to a plurality of SRAM cells (not shown). In addition, there are two pairs of independent input signals BS0 318, BS1 320, and BS2 322, BS3 324. The example schematic 300 also shows a pair of neighbor-control inputs T1 214 and C1 210 from a paired local evaluator 204 using dotted lines. For example, the neighbor local evaluator can be the local evaluator 204 of FIG. 2. The example local evaluator 300 also shows another set of neighbor control inputs G2 220 and G3 222 also coming from the paired local evaluator 204 using dotted lines. The example schematic 300 also includes a subarray selection, SUBA input 326. For example, the SUBA 326 can be a clock-triggered control that enables the operation of a particular subarray of the SRAM array.

The example schematic 300 is a type of flip-flop circuit using a differential GBL design. For example, the flip flop circuit can be used to implement the local evaluator (LE) block of logic diagram 200A of FIG. 2 above. The example schematic includes a plurality of inputs 302, 304, 306, 308, 310, 312, 314, 316 that receive LBL signal information to be processed depending on the logical state of neighbor control inputs T1 214, C1 210, G3 222, and G2 220. The LBL signals 302, 304, 308, 310, 312, 314, and 316, can be processed by the clock-triggered signal SUBA 326 in conjunction with enabling signals BS0 318, BS1 320, BS2 322, and BS3 324.

It is to be understood that the block diagram of FIG. 3 is not intended to indicate that the example schematic 300 is to include all of the components shown in FIG. 3. Rather, the example schematic can include fewer or additional components not illustrated in FIG. 3 (e.g., additional inputs, GBLs, neighbor control inputs, etc.). For example, although a differential GBL design is shown in the example schematic 300, the present techniques can also be applied to a single-ended GBL design.

FIG. 4 is an example truth table for encoding internal T/C nodes according to embodiments herein. The example truth table is generally referred to by the reference number 400.

The example truth table 400 includes columns of old GBL values 402, internal T/C node values 404, and new GBL values 406. The old GBL values 402 are divided into GBL values GC<0> 408, GT<0> 410, GC<1> 412, and GT<1> 414. The new GBL values 406 are divided into GBL values G<0> 416, G<1> 418, G<2> 420, and G<3> 422.

As shown in table 400, the old GBL values directly track the internal T/C nodes with respect to values. For example, given T/C node values of C<0>=1, T<0>=0, C<1>=1, T<1>=0, the old GBL values 408, 410, 412, 414 also have values 1, 0, 1, 0, respectively. Likewise, the rest of the old GBL values match their corresponding T/C node values in a one-to-one logical mapping. Thus, for each 1 in the T/C node values, a corresponding 1 is represented by a hot GBL in the former GBL design.

By contrast, the new GBL values 406 use one active GBL represented by a "1" for each internal T/C node configuration. For example, given T/C node values of C<0>=1, T<0>=0, C<1>=1, T<1>=0, the corresponding values for new GBLs 416, 418, 420, 422 are 0, 1, 0, 0, respectively. Thus, rather than using a one-to-one mapping, the new GBL values express the same four values using a single hot bit line represented by a "1." Similarly, internal T/C code configuration "1001" can be expressed by new GBLs 416, 418, 420, 422, as 0, 0, 0, 1, respectively. The internal T/C code configuration "0110" can be expressed as "0010" and the internal T/C code configuration "0101" can be expressed as "1000." Thus, each set of internal T/C codes 404 that were logically expressed using two hot GBLs can be logically expressed using one active GBL per configuration. In some examples, the logic for each GBL value can thus be expressed using T/C code values as G<0>=not(C<0>)*not(C<1>), G<1>=not(T<0>)*not(T<1>), G<2>=not(C<0>)*not(T<1>), and G<3>=not(T<0>)*not(C<1>). Moreover, the logic for each T/C code value can be expressed using the GBL values as C<0>=not[G<0>+G<2>], T<0>=not[G<1>+G<3>], C<1>=not[G<0>+G<3>], and T<1>=not[G<1>+G<2>].

It is to be understood that the block diagram of FIG. 4 is not intended to indicate that the table 400 is to include all of the components shown in FIG. 4. Rather, the table 400 can include fewer or additional columns or rows not illustrated in FIG. 4 (e.g., additional GBLs 402, internal T/C nodes 404, new GBLs values 406, etc.). For example, the number of bit lines in a local evaluator can be larger than 4, resulting sets of GBL and T/C values of five values or more.

Figure 5:
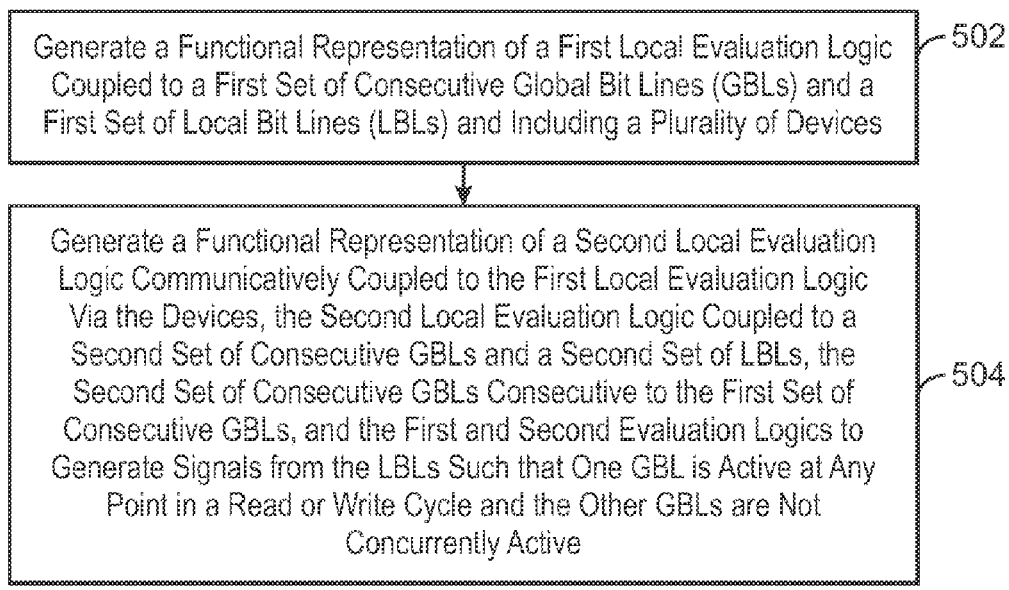
FIG. 5 is a process flow diagram of an example method that can generate a functional design model of an SRAM according to embodiments herein.

FIG. 5 is a process flow diagram of an example method that can generate a functional design model of an SRAM 200. The method 300 can be implemented with any suitable computing device, such as the computing device 100 of FIG. 1.

At block 502, an SRAM design module generates a functional representation of a first local evaluation logic coupled to a first set of consecutive global bit lines (GBLs) and a first set of local bit lines (LBLs). For example, four devices can be added to a traditional SRAM local evaluator to enable communication between two local evaluators 202 and 204 as described in detail in FIG. 3 above.

At block 504, the SRAM design module generates a functional representation of a second local evaluation logic communicatively coupled to the first local evaluation logic via the devices. The second local evaluation logic can be coupled to a second set of consecutive GBLs and a second set of LBLs. The second set of consecutive GBLs can be consecutive to the first set of consecutive GBLs. The first and second evaluation logics can generate signals from the LBLs such that one GBL is active at any point in a read or write cycle and the other GBLs are not concurrently active. The first set of consecutive GBLs can include two consecutive GBLs and the second set of consecutive GBLs can include two consecutive GBLs for a total of four consecutive GBLs. One of the total of the four consecutive GBLs can be powered at any point in the read or write cycle. In some examples, the SRAM design module can generate a functional representation of a set of devices in each of the first local evaluation logic and the second local evaluation logic to enable the local evaluation logics to be coupled to and to enable the one GBL to be active at any point in the read or write cycle. The set of devices can include four devices in each of the first local evaluation logic and the second local evaluation logic. In some examples, the SRAM design module can generate a functional representation of addi-
tional pairs of local evaluators such that additional GBLs and LBLs of the static random access memory are controlled by the additional pairs of local evaluation logics. In some examples, the SRAM design module can generate a functional representation of GBL receivers coupled to the GBLS. The GBL receivers can include four three-way NOR gates arranged as described in more detail in FIG. 2 above. The GBL receivers can decode the four GBL lines coming out of the two local evaluation logics into two complementary binary signals. The resulting functional representation of logic can thus enable T/C node values to be expressed using one active GBL as described in section 406 of Table 400 in FIG. 4 above. In some examples, the SRAM design module can also generate a functional representation to multiplex a plurality of LBLs into a single GBL based on a local evaluation logic multiplexing level. For example, two or four LBLs can be multiplexed into a single GBL depending on the local evaluation logic multiplexing level.

The process flow diagram of FIG. 5 is not intended to indicate that the operations of the method 500 are to be executed in any particular order, or that all of the operations of the method 500 are to be included in every case. Additionally, the method 500 can include any suitable number of additional operations.

Figure 6:
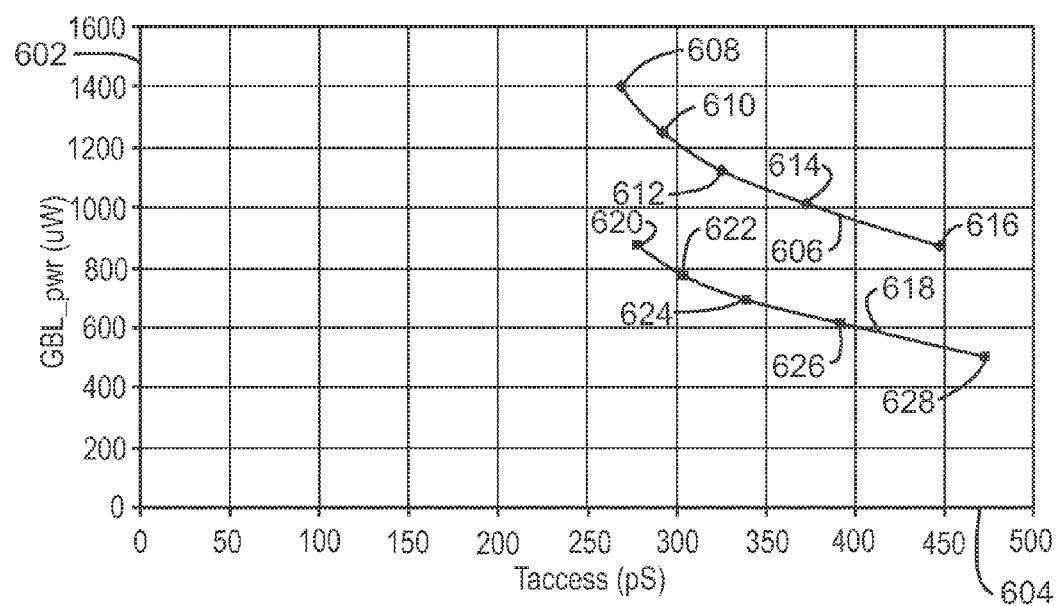
FIG. 6 is a graph showing power versus access time using one example of the techniques described herein.

FIG. 6 is a graph showing power versus access time using one example of the techniques described herein. The graph is generally referred to by the reference number 600.

In the example graph 600, GBL power usage 602 is represented by the vertical axis while access time 604 in picoseconds is expressed along the horizontal axis. A curve 606 is shown including points 608, 610, 612, 614, and 616. A second curve 618 is shown below curve 606 and includes points 620, 622, 624, 626, and 628.

In the example graph 600, curve 606 represents the GBL power usage of a traditional two-of-four logic, while curve 618 represents the GBL power usage of a one-of-four logic. As can be seen in graph 600, for an access time of approximately 270 picoseconds, the traditional two-of-four logic uses 1400 microwatts of power at the GBLs. By contrast, the one-of-four logic uses approximately 890 microwatts. Thus, the one-of-four logic exhibits a (1400−890)/1400=36% reduction in power usage at the GBLs. Moreover, the reduction in power usage remains at an approximately stead 500 microwatts such that at an access time of 450 picoseconds, the reduction of power is (880−520)/880=40%.

Figure 7:
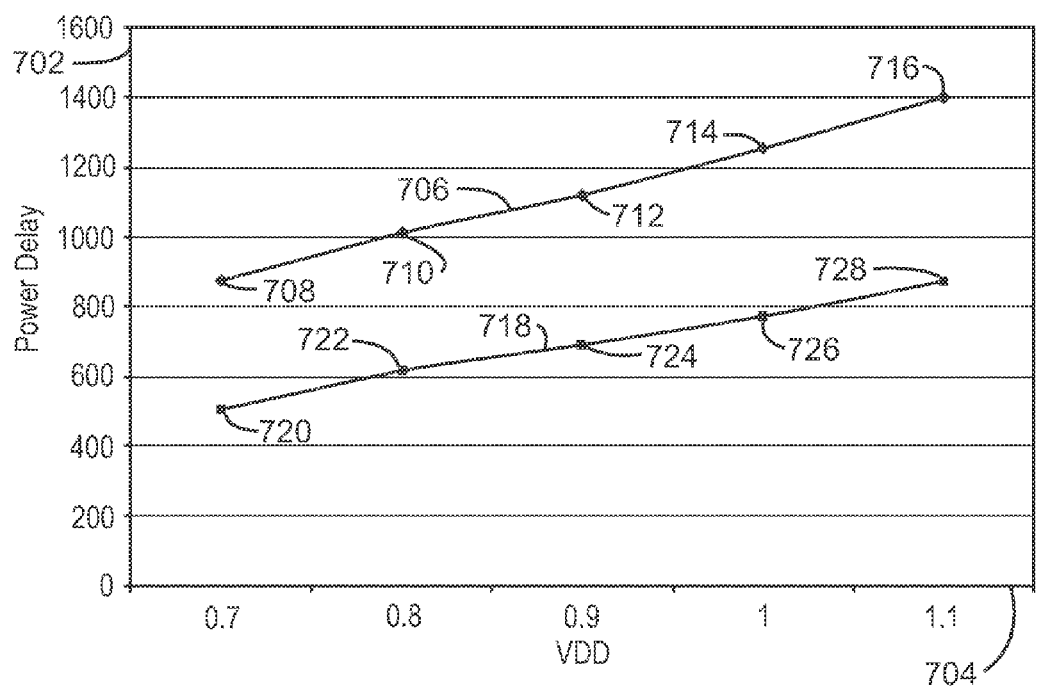
FIG. 7 is a graph showing power delay versus voltage using one example of the techniques described herein.

FIG. 7 is a graph showing power delay versus voltage using one example of the techniques described herein. The graph is generally referred to by the reference number 700.

In graph 700, power delay 702 is represented by the vertical axis while voltage 704 is represented by the horizontal axis. A curve 706 is shown with points 708, 710, 712, 714, and 716. A second curve 718 is shown below curve 716 and includes points 720, 722, 724, 726, and 728.

In the graph 700, curve 706 represents the power delay 702 of a traditional two-hot-of-four design as a function of voltage 704. Curve 718 represents the power delay 702 of a one-hot-of-four design as a function of voltage. As shown in graph 700, the traditional one-hot-of-four design has a higher power delay 702 for every voltage. In addition, the traditional curve 706 shows a higher slope from point 712 to point 716. Thus, as voltage 704 is increased past 0.9 Volts the power delay 702 of the traditional curve 706 increases faster. The improved two-hot-of-four design, on the other hand, shows a relatively stable slope throughout the voltages 704 and is therefore shows substantially less power delay 702 at a point 728 as compared to point the 716 of the traditional curve 706 at a voltage 704 of approximately 1.1

Volts. Thus, the techniques described herein exhibit less power delay 702 as compared to the traditional design in general, and even less when voltage 704 is increased.

Figure 8:
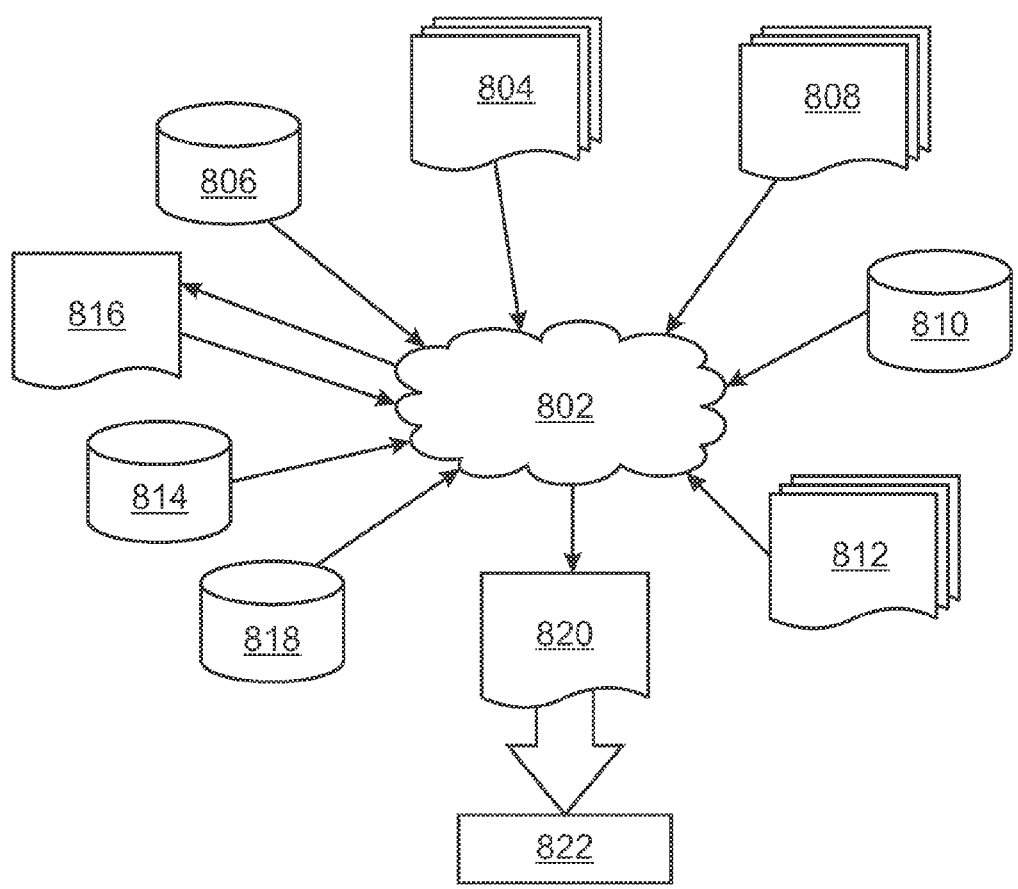
FIG. 8 is a block diagram of an exemplary design flow used for example, in semiconductor IC logic design, simulation, test, layout, and manufacture.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in FIG. 2. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 804 that is preferably processed by a design process 802. Design structure 804 may be a logical simulation design structure generated and processed by design process 802 to produce a logically equivalent functional representation of a hardware device. Design structure 804 may also or alternatively comprise data and/or program instructions that when processed by design process 802, generate a functional representation of the physical structure of a hardware device. Whether representing functional and/or structural design features, design structure 804 may be generated using electronic computer-aided design (ECAD) such as implemented by a core developer/designer. When encoded on a machine-readable data transmission, gate array, or storage medium, design structure 804 may be accessed and processed by one or more hardware and/or software modules within design process 802 to simulate or otherwise functionally represent an electronic component, circuit, electronic or logic module, apparatus, device, or system such as those shown in FIGS. 1-2. As such, design structure 804 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 802 preferably employs and incorporates hardware and/or software modules for synthesizing, translating, or otherwise processing a design/simulation functional equivalent of the components, circuits, devices, or logic structures shown in FIG. 2 to generate a netlist 816 which may contain design structures such as design structure 804. Netlist 816 may comprise, for example, compiled or otherwise processed data structures representing a list of wires, discrete components, logic gates, control circuits, I/O devices, models, etc. that describes the connections to other elements and circuits in an integrated circuit design. Netlist 816 may be synthesized using an iterative process in which netlist 816 is resynthesized one or more times depending on design specifications and parameters for the device. As with other design structure types described herein, netlist 816 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 802 may include hardware and software modules for processing a variety of input data structure types including netlist 816. Such data structure types may reside, for example, within library elements 806 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 808, characterization data 810, verification data 812, design rules 814, and test data files 818 which may include input test patterns, output test results, and other testing information. Design process 802 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 802 without deviating from the scope and spirit of the invention. Design process 802 may also include modules for performing standard circuit design processes such as timing analysis, verification, design rule checking, place and route operations, etc.

Design process 802 employs and incorporates logic and physical design tools such as HDL compilers and simulation model build tools to process design structure 804 together with some or all of the depicted supporting data structures along with any additional mechanical design or data (if applicable), to generate a second design structure 820. Design structure 820 resides on a storage medium or programmable gate array in a data format used for the exchange of data of mechanical devices and structures (e.g. information stored in an ICES, DXF, Parasolid XT, JT, DRG, or any other suitable format for storing or rendering such mechanical design structures). Similar to design structure 804, design structure 820 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2.

In one embodiment, design structure 820 may comprise a compiled, executable HDL simulation model that functionally simulates the devices shown in FIG. 2.

Design structure 820 may also employ a data format used for the exchange of layout data of integrated circuits and/or symbolic data format (e.g. information stored in a GDSII (GDS2), GL1, OASIS, map files, or any other suitable format for storing such design data structures). Design structure 820 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2. Design structure 820 may then proceed to a stage 822 where, for example, design structure 820: proceeds to tape-out, is released to manufacturing, is released to a mask house, is sent to another design house, is sent back to the customer, etc.

The present techniques may be a system, a method, and/or a computer program product. The computer program product may include a machine-readable storage medium (or media) having machine-readable program instructions thereon for causing a processor to carry out aspects of the present invention.

The machine-readable storage medium can be a tangible device that can retain and store instructions for use by an instruction execution device. The machine-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the machine-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A machine-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Machine-readable program instructions described herein can be downloaded to respective computing/processing devices from a machine-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives machine-readable program instructions from the network and forwards the machine-readable program instructions for storage in a machine-readable storage medium within the respective computing/processing device.

Machine-readable program instructions for carrying out operations of the present techniques may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The machine-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the machine-readable program instructions by utilizing state information of the machine-readable program instructions to personalize the electronic circuitry, in order to perform aspects of the present techniques.

Aspects of the present techniques are described herein with reference to flowchart illustrations and/or block diagrams of methods, apparatus (systems), and computer program products according to embodiments of the techniques. It will be understood that each block of the flowchart illustrations and/or block diagrams, and combinations of blocks in the flowchart illustrations and/or block diagrams, can be implemented by machine-readable program instructions.

These machine-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These machine-readable program instructions may also be stored in a machine-readable storage medium that can direct a computer, a programmable data processing apparatus, and/or other devices to function in a particular manner, such that the machine-readable storage medium having instructions stored therein comprises an article of manufacture including instructions which implement aspects of the function/act specified in the flowchart and/or block diagram block or blocks.

The machine-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present techniques. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
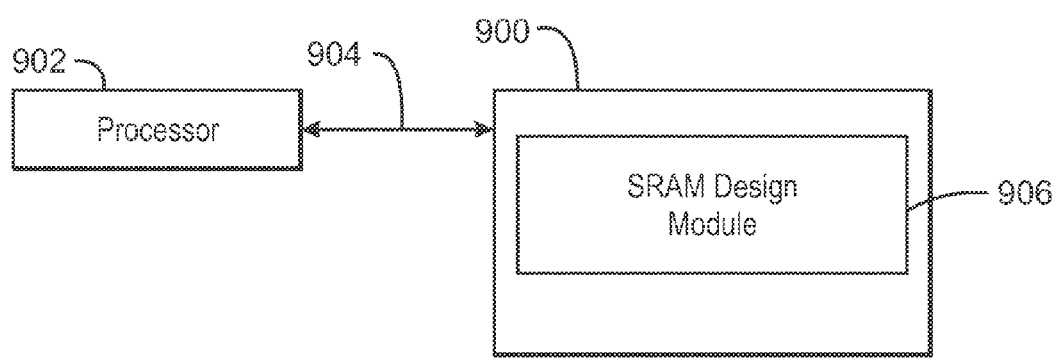
FIG. 9 is a block diagram of an example tangible, non-transitory machine-readable medium that can embody a design structure for use in the design, manufacture, or simulation of an SRAM.

Referring now to FIG. 9, a block diagram is depicted of an example of a tangible, non-transitory machine-readable medium that can embody a design structure for use in the design, manufacture, or simulation of an SRAM. The tangible, non-transitory, machine-readable medium 900 may be accessed by a processor 902 over a computer interconnect 904. Furthermore, the tangible, non-transitory, machine-readable medium 900 may include code to direct the processor 902 to perform the operations of the current method.

The various software components discussed herein may be stored on the tangible, non-transitory, machine-readable medium 900, as indicated in FIG. 9. For example, an SRAM design module 906 may be used in the design, manufacture, or simulation of an SRAM 200. In some embodiments, the processor design module 906 can be used to design an SRAM 200 with a one-hot-of-four design. The processor design module 906 may also be used to manufacture the SRAM 200 according to the design. In some examples, the processor design module 906 may also be used to simulate an SRAM 200. The SRAM 200 can include plurality of local evaluators. Each local evaluator can be communicatively coupled to at least one other evaluator. The coupled local evaluators can share LBL signals via a plurality of input/output lines between a set of devices in each local evaluator. The LBL signals can be used to generate GBL signals. One GBL coupled to the plurality of local evaluators can to be active at any point in a read or write cycle.

In some examples, the SRAM 200 may also include four devices in each local evaluator. In some examples, the local evaluators can be coupled in pairs. Each local evaluator can also be coupled to two GBLs. In some examples, one GBL out of a total of four GBLs is to be powered at any point in a cycle. In some examples, the design structure includes a netlist. In some examples, the design structure can reside on a storage medium as a data format used for the exchange of layout data of integrated circuits. In some examples, the design structure can resides in a programmable gate array, an application-specific integrated circuit (ASIC) chip, or a high-speed processor. For example, the design structure can reside in an SRAM on the high-speed processor.

It is to be understood that any number of additional software components not shown in FIG. 9 may be included within the tangible, non-transitory, machine-readable medium 900, depending on the specific application.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A design structure tangibly embodied in a machine-readable storage medium used in design, manufacture, or simulation of an static random access memory (SRAM), the design structure having elements that, when processed in a semiconductor manufacturing facility, produce an SRAM that comprises:
   a first local evaluator coupled to a first global bit line (GBL) and a first set of local bit lines (LBLs), the first GBL comprising one of a first pair of consecutive GBLs coupled to the first local evaluator;
   a second local evaluator communicatively coupled to the first local evaluator, the second local evaluator coupled to a second GBL and second set of LBLs, the second GBL comprising one of a second pair of consecutive GBLs coupled to the second local evaluator, the second pair of GBLs consecutive to the first pair of consecutive GBLs, the second GBL consecutive to the first GBL, the first and second evaluators to generate signals from the LBLs such that only one GBL of a combined first and second GBLs is active at any point in a read or write cycle, the first local evaluator further comprising four devices that are communicatively coupled to four devices in the second local evaluator.

2. The design structure of claim 1, the local evaluators to be coupled in pairs, each local evaluator coupled to at least one GBL.

3. The design structure of claim 1, wherein the design structure comprises a netlist.

4. The design structure of claim 1, wherein the design structure resides on storage medium as a data format used for the exchange of layout data of integrated circuits.

5. The design structure of claim 1, wherein the design structure resides in a programmable gate array, an application-specific integrated circuit (ASIC) chip, or a high-speed processor.

6. A static random access memory (SRAM), comprising:
   a first local evaluation logic coupled to a first set of consecutive global bit lines (GBLs) and a first set of local bit lines (LBLs);
   a second local evaluation logic communicatively coupled to the first local evaluation logic, the second local evaluation logic coupled to a second set of consecutive GBLs and second set of LBLs, the second set of consecutive GBLs consecutive to the first set of consecutive GBLs, the first and second evaluation logics to generate a one-hot-of-four signal from the LBLs such that only one GBL of a combined first and second set of GBLs is active at any point in a read or write cycle, wherein the first set of consecutive GBLs comprises two consecutive bit lines and the second set of consecutive GBLs each comprises two consecutive GBLs for a total of four consecutive GBLs.

7. The SRAM of claim 6, further comprising a set of devices in each local evaluation logic, the set of devices to couple the local evaluation logics and to enable the one GBL to be active.

8. The SRAM of claim 7, wherein the set of devices comprises four devices in each local evaluation logic.

9. The SRAM of claim 6, further comprising additional pairs of local evaluation logics, wherein additional GBLs and LBLs of the SRAM are controlled by the additional pairs of local evaluation logics.

10. The SRAM of claim 6, further comprising a GBL receiver comprising four NOR gates to decode a one-hot-of-four signal produced by the two local evaluation logics into a group of 4 GBL wires comprising two one-hot-of-two signals.

11. The SRAM of claim 6, wherein the first evaluation logic and the second evaluation logic are to multiplex two or four LBLs into a single GBL based on a local evaluation logic multiplexing level.

12. A computing system, comprising:
   a static random access memory (SRAM) further comprising:
      a first local evaluation logic coupled to a first set of consecutive global bit lines (GBLs) and a set of local bit lines (LBLs);
      a second local evaluation logic communicatively coupled to the first local evaluation logic, the second local evaluation logic coupled to a second set of consecutive GBLs and second set of LBLs, the second set of consecutive GBLs consecutive to the first set of consecutive GBLs, the first and second evaluation logics to generate a one-hot-of-four signal from the LBLs such that only one GBL is active at any point in a read or write cycle, wherein the first set of consecutive GBLs comprises two consecutive bit lines and the second set of consecutive GBLs comprises two consecutive GBLs for a total of four consecutive GBLs.

13. The computing system of claim 12, further comprising a set of devices in each local evaluation logic, the set of devices to couple the local evaluation and enable the one GBL to be active at any point in the read or write cycle.

14. The computing system of claim 13, wherein the set of devices comprises four devices in each local evaluation logic.

15. The computing system of claim 12, further comprising a GBL receiver comprising four NOR gates to decode the one-hot-of-four signal into two pairs of one-hot-of-two signals over four GBL wires.

* * * * *